(12) United States Patent
Sun et al.

(10) Patent No.: US 11,348,977 B2
(45) Date of Patent: May 31, 2022

(54) DISPLAY PANEL AND ELECTRONIC DEVICE

(71) Applicant: Wuhan China Star Optoelectronics Technology Co., Ltd., Wuhan (CN)

(72) Inventors: Weiting Sun, Wuhan (CN); Huanhuan Bu, Wuhan (CN)

(73) Assignee: Wuhan China Star Optoelectronics Technology Co., Ltd., Wuhan (CN)

( * ) Notice: Subject to any disclaimer, the term of this patent is extended or adjusted under 35 U.S.C. 154(b) by 274 days.

(21) Appl. No.: 16/632,880

(22) PCT Filed: Sep. 30, 2019

(86) PCT No.: PCT/CN2019/109678
§ 371 (c)(1),
(2) Date: Jan. 22, 2020

(87) PCT Pub. No.: WO2020/232949
PCT Pub. Date: Nov. 26, 2020

(65) Prior Publication Data
US 2021/0366996 A1 Nov. 25, 2021

(30) Foreign Application Priority Data
May 22, 2019 (CN) .......................... 201910427184.2

(51) Int. Cl.
*H01L 27/14* (2006.01)
*H01L 27/32* (2006.01)

(52) U.S. Cl.
CPC ........ *H01L 27/322* (2013.01); *H01L 27/3227* (2013.01); *H01L 27/3269* (2013.01); *H01L 27/3272* (2013.01)

(58) Field of Classification Search
CPC ..... H01L 25/048; H01L 25/167; H01L 27/15; H01L 27/288; H01L 27/32; H01L 51/0032; H01L 51/05; H01L 51/00; H01L 27/01; H01L 23/5222; H01L 27/322; H01L 27/3227; H01L 27/3269; H01L 27/3272; H01L 51/502; H01L 51/5293; H01L 51/56; H01L 27/3232; G01Q 60/14;
(Continued)

(56) References Cited

U.S. PATENT DOCUMENTS

2016/0276396 A1* 9/2016 Tayanaka .......... H01L 27/14685
2018/0052359 A1* 2/2018 Umemoto ................ G09F 9/30
2019/0280039 A1 9/2019 Jia et al.
(Continued)

FOREIGN PATENT DOCUMENTS

CN 106373969 2/2017
CN 106654067 A * 5/2017 ......... H01L 27/3246
(Continued)

*Primary Examiner* — Samuel Park

(57) ABSTRACT

The present application provides a display panel and an electronic device. The display panel includes a control circuit, a light emitting layer, a color film layer, and a cover plate, wherein the color film layer is disposed between the light emitting layer and the cover plate, and the color film layer comprises a photosensitive region comprising a plurality of color film units and a plurality of photosensors which are spaced apart. Wherein, a first light shielding film is disposed on surfaces of the plurality of photosensors facing the light emitting layer.

15 Claims, 2 Drawing Sheets

(58) Field of Classification Search
CPC ............ G01R 31/2656; G01R 31/2851; G02F 1/1333; G06K 9/0004; G06K 9/209; G09F 9/00
See application file for complete search history.

(56) References Cited

U.S. PATENT DOCUMENTS

2020/0134281 A1    4/2020  Han et al.
2021/0167134 A1*  6/2021  Li ......................... H01L 27/323

FOREIGN PATENT DOCUMENTS

CN         106959757       7/2017
CN         208888832 U  *  5/2019

* cited by examiner

DISPLAY PANEL AND ELECTRONIC DEVICE

RELATED APPLICATIONS

This application is a National Phase of PCT Patent Application No. PCT/CN2019/109678 having International filing date of Sep. 30, 2019, which claims the benefit of priority of Chinese Patent Application No. 201910427184.2 filed on May 22, 2019. The contents of the above applications are all incorporated by reference as if fully set forth herein in their entirety.

FIELD AND BACKGROUND OF THE INVENTION

The present invention relates to the field of electronic display, and in particular, to a display panel and an electronic device.

As an emerging encryption method, fingerprint imaging recognition technology has significant advantages such as high difficulty in cracking, convenient use, rapid response, etc., and has been widely used in existing smart devices.

Technical Problems

In the existing smart devices, the fingerprint imaging recognition technology is realized by a separate fingerprint recognition module, and then connected to a display panel and a control circuit of the smart device through a connecting circuit. Such setting has two drawbacks: on the one hand, the display panel of the smart device needs to be provided with a light transmission area, which increases a process difficulty; on the other hand, the separately provided fingerprint recognition module also increases a thickness of the smart device.

Therefore, it is necessary to optimize the smart device integrated with the fingerprint recognition function in the prior art.

SUMMARY OF THE INVENTION

The present application provides a display panel and an electronic device to optimize an existing smart device integrated with a fingerprint recognition function.

In order to solve the above problems, the present application provides a display panel comprising a control circuit, a light emitting layer, a color film layer and a cover plate, wherein the color film layer is disposed between the light emitting layer and the cover plate, and the color film layer comprises a photosensitive region comprising a plurality of color film units and a plurality of photosensors which are spaced apart;

wherein, a first light shielding film is disposed surfaces of the plurality of photosensors facing the light emitting layer.

According to one aspect of the application, wherein each color film unit comprises at least one red filter, at least one blue filter, and at least one green filter, a light shielding material is filled between any two adjacent filters; each photosensor is disposed between two adjacent color filter units, and a light shielding material is filled between the photosensor and the color filter unit According to one aspect of the application, wherein a ratio of the color filter units to the photosensors in the photosensitive region is 1:1 or 1:2.

According to one aspect of the application, wherein the color film layer comprises a substrate, and the color film unit and the photosensor are disposed on a surface of the substrate facing the light emitting layer.

According to one aspect of the application, wherein each photosensor comprises:

at least one thin film transistor located on the substrate;
a first insulating layer covering the at least one thin film transistor;
a photodiode disposed on the first insulating layer and electrically connected to the at least one thin film transistor through via holes.

According to one aspect of the application, wherein a projection of the photodiode on the substrate separates from a projection of the at least one thin film transistor on the substrate.

According to one aspect of the application, wherein the photodiode comprises:

a first electrode disposed on the first insulating layer, and electrically connected to the at least one thin film transistor through via holes;
a second insulating layer covering the first electrode and having an opening exposing the first electrode;
a photosensitive material disposed in the opening; and
a second electrode covering the photosensitive material.

According to one aspect of the application, wherein the first electrode is a transparent electrode and the second electrode is a reflective electrode.

According to one aspect of the application, wherein the first light shielding film covers the second electrode.

According to one aspect of the application, wherein the color film layer further comprises a second light shielding film disposed on a surface of the substrate away from the light emitting layer.

According to one aspect of the application, wherein a projection of the second light shielding film on the substrate covers a projection of the at least one thin film transistor on the substrate, and the projection of the second light shielding film on the substrate separates from a projection of the photodiode on the substrate.

According to one aspect of the application, wherein the display panel further includes a flexible circuit board connected to the color film layer, and the flexible circuit board transmits an electrical signal generated by the photosensitive region to a control chip.

The present application further provides an electronic device comprising a display panel, wherein the display panel comprises a control circuit, a light emitting layer, a color film layer and a cover plate;

wherein the color film layer is disposed between the light emitting layer and the cover plate, and the color film layer comprises a photosensitive region comprising a plurality of color film units and a plurality of photosensors which are spaced apart;

wherein a first light shielding film is disposed surfaces of the plurality of photosensors facing the light emitting layer.

According to one aspect of the application, wherein each color film unit comprises at least one red filter, at least one blue filter, and at least one green filter, a light shielding material is filled between any two adjacent filters; each photosensor is disposed between two adjacent color filter units, and a light shielding material is filled between the photosensor and the color filter unit According to one aspect of the application, wherein a ratio of the color filter units to the photosensors in the photosensitive region is 1:1 or 1:2.

According to one aspect of the application, wherein the color film layer comprises a substrate, and the color film unit and the photosensor are disposed on a surface of the substrate facing the light emitting layer.

According to one aspect of the application, wherein each photosensor comprises:

at least one thin film transistor located on the substrate;

a first insulating layer covering the at least one thin film transistor;

a photodiode disposed on the first insulating layer and electrically connected to the at least one thin film transistor through via holes.

According to one aspect of the application, wherein a projection of the photodiode on the substrate separates from a projection of the at least one thin film transistor on the substrate.

According to one aspect of the application, wherein the photodiode comprises:

a first electrode disposed on the first insulating layer, and electrically connected to the at least one thin film transistor through via holes;

a second insulating layer covering the first electrode and having an opening exposing the first electrode;

a photosensitive material disposed in the opening; and a second electrode covering the photosensitive material.

According to one aspect of the application, wherein the first electrode is a transparent electrode and the second electrode is a reflective electrode, and the first light shielding film covers the second electrode.

Beneficial Effects

In the present application, the photosensor is disposed in the color film layer and spaced apart from the color filter in the color film layer, thereby achieving the purpose of integrating the photosensor into the display panel. The increase in cost due to the provision of the photosensitive unit in the prior art is prevented, and the thickness of the electronic device can be effectively reduced. Compared with the prior art, the present invention optimizes the smart device integrated with the fingerprint recognition function, and effectively reduces the cost without affecting the performance of the electronic device.

DESCRIPTION OF SPECIFIC EMBODIMENTS OF THE INVENTION

Figure 1:
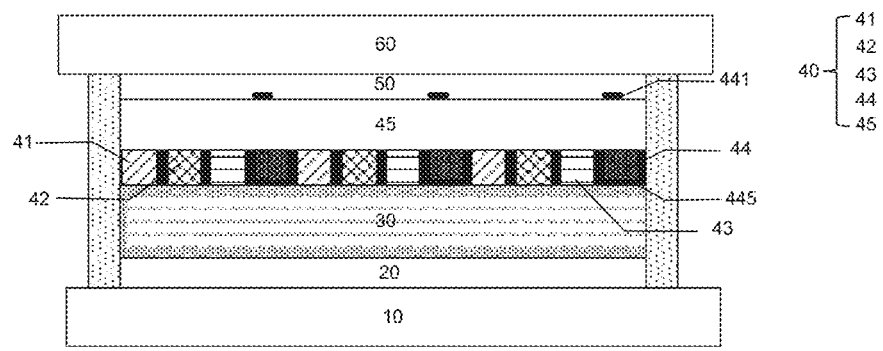
FIG. 1 is a structural diagram of a display panel in a specific embodiment of the present application.

Description of following embodiment, with reference to accompanying drawings, is used to exemplify specific embodiments which may be carried out in the present disclosure. Directional terms mentioned in the present disclosure, such as "top", "bottom", "front", "back", "left", "right", "inside", "outside", "side", etc., are only used with reference to orientation of the accompanying drawings. Therefore, the directional terms are intended to illustrate, but not to limit, the present disclosure. In the drawings, components having similar structures are denoted by same numerals.

The present application provides a display panel and an electronic device to optimize an existing smart device integrated with a fingerprint recognition function.

Referring to FIG. 1, FIG. 1 is a structural diagram of a display panel in an embodiment of the present application. The display panel includes a substrate 10, a control circuit 20, a light emitting layer 30, a color film layer 40, and a cover plate 60. The cover plate 60 is bonded over the color film layer 40 by optical glue. In the present application, the display panel could be a liquid crystal display panel or an organic light emitting diode (OLED) display panel. When the display panel is a liquid crystal display panel, the light emitting layer 30 is a liquid crystal layer, and the display panel further includes a backlight structure under the substrate 10. When the display panel is an OLED display panel, the light emitting layer 30 is an OLED material layer, and the light emitted by the OLED material layer is white light.

Referring to FIG. 1, in this embodiment, the color film layer 40 is located between the light emitting layer 30 and the cover plate 60. The color film layer 40 includes a photosensitive region comprising a plurality of color film units and a plurality of photosensors 44, the plurality of color film units and the plurality of photosensors 44 are spaced apart.

In the present application, a first light shielding film 445 is disposed on a side surface of the plurality of photosensors 44 facing the light emitting layer 30. Each color film unit includes at least one red color filter 41, at least one blue color filter 42, and at least one green color filter 43, and a light shielding material is filled between any two adjacent color filters. Referring to FIG. 1, each photosensor 44 is disposed between two adjacent color filters, and a light shielding material is filled between the photosensors 44 and the color film units. The light shielding material and the first light shielding film 441 are formed of same material, such as a black light shielding resin.

Figure 2:
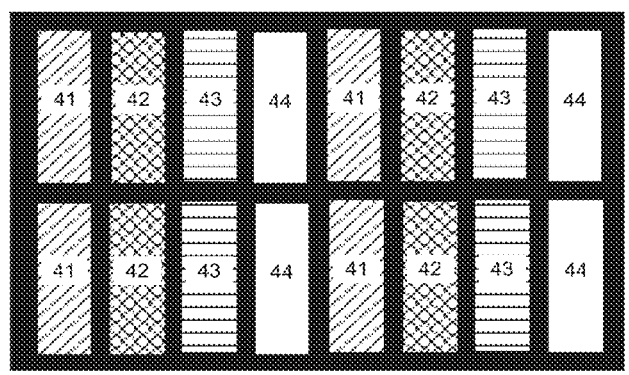
FIG. 2 is a partial plan view of a color film layer of a display panel in an embodiment of the present invention.
Figure 3:
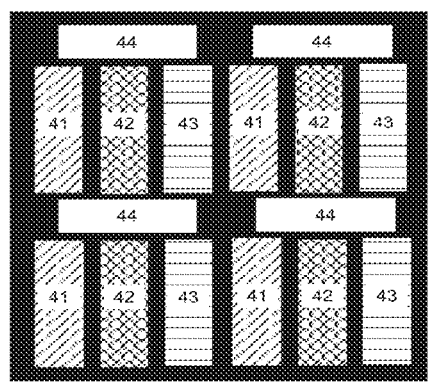
FIG. 3 is a partial plan view of a color film layer of a display panel in another embodiment of the present invention.
Figure 4:
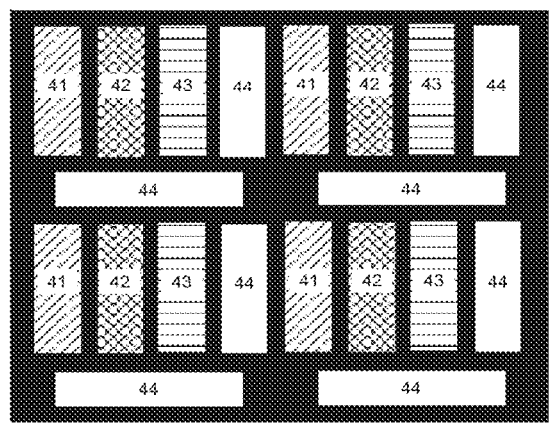
FIG. 4 is a partial plan view showing a color film layer of a display panel in a third embodiment of the present invention.

In order not to affect an aperture ratio and resolution of the display panel, a number of photosensors in the photosensitive region cannot be excessive. In this embodiment, a ratio of the color film units to the photosensors 44 in the photosensitive region is 1:1 or 1:2. See FIG. 2 to FIG. 4. FIG. 2 is a partial plan view of a color film layer of a display panel in one embodiment of the present invention. Wherein, the ratio of the color film units and the photosensors 44 in the photosensitive region is 1:1, and the photosensors 44 are disposed in adjacent color film units at intervals along a first direction. FIG. 3 is a partial plan view of a color film layer of a display panel in another embodiment of the present invention. Wherein, the ratio of the color film units to the photosensors 44 in the photosensitive region is 1:1, and the photosensors 44 are disposed in adjacent color film units at intervals along a second direction. FIG. 4 is a partial plan view of a color film layer of the display panel in a third embodiment of the present invention. Wherein, the ratio of the color film units to the photosensors 44 in the photosensitive region is 1:2, and the photosensors 44 are disposed in adjacent color film units at intervals along the first direction and the second direction.

In the present application, the color film layer 40 further includes a substrate 45, and the color film units and the photosensors 44 are disposed on a surface of the substrate 45 facing the light emitting layer 30. Preferably, the substrate 45 has a high light transmittance, such as a glass substrate or a transparent acrylic substrate.

Figure 5:
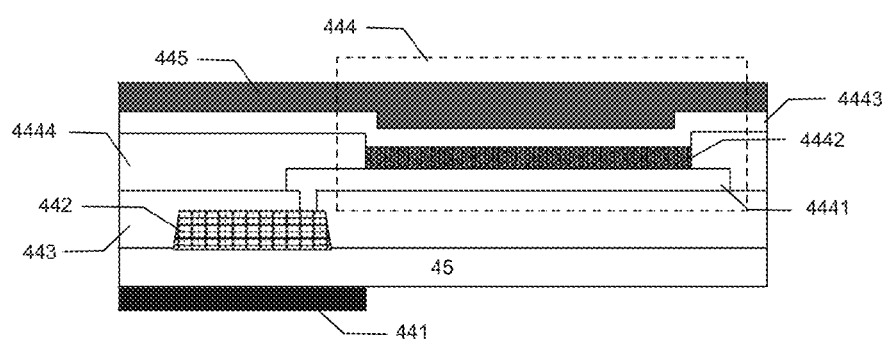
FIG. 5 is a structural diagram of a structure of a photoresistor in a color film layer in an embodiment of the present invention.

Referring to FIG. 5, the photosensors 44 include at least one thin film transistor 442, a first insulating layer 443, and a photodiode 444.

The at least one thin film transistor 442 is located on the substrate 45. In practice, the thin film transistor 442 and the substrate 45 further include a buffer layer. Because the first light shielding film 441 is disposed on the side of the substrate facing the light emitting layer 30, the first light shielding film 441 can effectively block the light of the light emitting layer 30. Thereby, light is prevented from entering the thin film transistor 442 and the photodiode 444. On the one hand, it is possible to prevent a threshold voltage drift caused by an illumination of the active region in the thin film transistor 442. On the other hand, it is possible to prevent light of the light emitting layer 30 from interfering with the photodiode 444, causing the photosensitive device to make a wrong judgment.

The first insulating layer 443 covers the at least one thin film transistor 442 for isolating the thin film transistor 442 and the photodiode 444. The photodiode 444 is disposed on the first insulating layer 443 and electrically connected to the at least one thin film transistor 442 through via holes. A projection of the photodiode 444 on the substrate 45 does not overlap with a projection of the at least one thin film transistor 442 on the substrate 45. Such an arrangement can effectively prevent metal traces and other opaque regions in the thin film transistor 442 from blocking the photodiode 444.

In the present embodiment, the photodiode 444 includes a first electrode 4441, a second insulating layer 4444, a photosensitive material 4442, and a second electrode 4443.

The first electrode 4441 is located on the first insulating layer 443 and is electrically connected to the at least one thin film transistor 442 through via holes. The second insulating layer 4444 covers the first electrode 4441 and has an opening exposing the first electrode 4441. The photosensitive material 4442 is located in the opening. The second electrode 4443 covers the photosensitive material 4442.

In this embodiment, the first electrode 4441 is a transparent electrode, and the second electrode 4443 is a reflective electrode. The reflective electrode can be a metal electrode such as silver, copper, gold, or the like having good electrical conductivity and reflectivity. The transparent electrode can be a transparent conductive material such as indium tin oxide. The first light shielding film 441 covers the second electrode 4443.

In this embodiment, the color film layer 40 further includes a second light shielding film 445 disposed on a surface of the substrate 45 away from the light emitting layer 30. A projection of the second light shielding film 445 on the substrate 45 covers a projection of the at least one thin film transistor 442 on the substrate 45, and the projection of the second light shielding film 445 on the substrate 45 does not overlap with the projection of the photodiode 444 on the substrate 45.

In this embodiment, the display panel further includes a flexible circuit board connected to the color film layer 40, and the flexible circuit board transmits an electrical signal generated by the photosensitive region to a control chip. The setting of the flexible circuit board is a common technical means in the art, and details are not described herein again.

Accordingly, the present application also provides an electronic device, which includes the display panel as described above.

In the present application, photosensors are disposed in the color film layer and spaced apart from the color filters in the color film layer, thereby achieving the purpose of integrating the photosensor into the display panel. The increase in cost due to the provision of the photosensitive unit in the prior art is prevented, and the thickness of the electronic device can be effectively reduced. Compared with the prior art, the present invention optimizes the smart device integrated with the fingerprint recognition function, and effectively reduces the cost without affecting the performance of the electronic device.

As is understood by persons skilled in the art, the foregoing preferred embodiments of the present disclosure are illustrative rather than limiting of the present disclosure. It is intended that they cover various modifications and that similar arrangements be included in the spirit and scope of the present disclosure, the scope of which should be accorded the broadest interpretation so as to encompass all such modifications and similar structures.

What is claimed is:

1. A display panel comprising a control circuit, a light emitting layer, a color film layer, and a cover plate, wherein the color film layer is disposed between the light emitting layer and the cover plate, and the color film layer comprises a photosensitive region comprising a plurality of color film units and a plurality of photosensors which are spaced apart;
   wherein a first light shielding film is disposed on surfaces of the plurality of photosensors facing the light emitting layer,
   wherein the color film layer further comprises a substrate, and the color film units and the photosensors are disposed on a surface of the substrate facing the light emitting layer,
   wherein each of the photosensors comprises: at least one thin film transistor located on the substrate; a first insulating layer covering the at least one thin film transistor; and a photodiode disposed on the first insulating layer and electrically connected to the at least one thin film transistor through via holes, and
   wherein the color film layer further comprises a second light shielding film disposed on a surface of the substrate away from the light emitting layer.

2. The display panel according to claim 1, wherein each of the color film units comprises at least one red filter, at least one blue filter, and at least one green filter, a light shielding material is filled between any two adjacent filters, each of the photosensors is disposed between two adjacent color film units, and the light shielding material is filled between the photosensors and the color filter units.

3. The display panel according to claim 2, wherein a ratio of the color film units to the photosensors in the photosensitive region is 1:1 or 1:2.

4. The display panel according to claim 1, wherein a projection of the photodiode on the substrate does not overlap with a projection of the at least one thin film transistor on the substrate.

5. The display panel of claim 1, wherein the photodiode comprises:
   a first electrode disposed on the first insulating layer and electrically connected to the at least one thin film transistor through via holes;
   a second insulating layer covering the first electrode and having an opening exposing the first electrode;
   a photosensitive material disposed in the opening; and
   a second electrode covering the photosensitive material.

6. The display panel according to claim 5, wherein the first electrode is a transparent electrode and the second electrode is a reflective electrode.

7. The display panel according to claim 5, wherein the first light shielding film covers the second electrode.

8. The display panel according to claim 1, wherein a projection of the second light shielding film on the substrate covers a projection of the at least one thin film transistor on the substrate, and the projection of the second light shielding film on the substrate does not overlap with a projection of the photodiode on the substrate.

9. The display panel according to claim 1, wherein the display panel further comprises a flexible circuit board connected to the color film layer, and the flexible circuit board transmits an electrical signal generated by the photosensitive region to a control chip.

10. An electronic device comprising a display panel, wherein the display panel comprises a control circuit, a light emitting layer, a color film layer, and a cover plate;

wherein the color film layer is disposed between the light emitting layer and the cover plate, and the color film layer comprises a photosensitive region comprising a plurality of color film units and a plurality of photosensors which are spaced apart;

wherein a first light shielding film is disposed on surfaces of the plurality of photosensors facing the light emitting layer, wherein the color film layer further comprises a substrate, and the color film units and the photosensors are disposed on a surface of the substrate facing the light emitting layer, wherein each of the photosensors comprises: at least one thin film transistor located on the substrate; a first insulating layer covering the at least one thin film transistor; and a photodiode disposed on the first insulating layer and electrically connected to the at least one thin film transistor through via holes, and wherein the color film layer further comprises a second light shielding film disposed on a surface of the substrate away from the light emitting layer.

11. The electronic device according to claim 10, wherein each of the color film units comprises at least one red filter, at least one blue filter, and at least one green filter, a light shielding material is filled between any two adjacent filters, each of the photosensors is disposed between two adjacent color film units, and the light shielding material is filled between the photosensors and the color film units.

12. The electronic device according to claim 11, wherein a ratio of the color film units to the photosensors in the photosensitive region is 1:1 or 1:2.

13. The electronic device according to claim 10, wherein a projection of the photodiode on the substrate does not overlap with a projection of the at least one thin film transistor on the substrate.

14. The electronic device according to claim 10, wherein the photodiode comprises:

a first electrode disposed on the first insulating layer and electrically connected to the at least one thin film transistor through via holes;

a second insulating layer covering the first electrode and having an opening exposing the first electrode;

a photosensitive material disposed in the opening; and a second electrode covering the photosensitive material.

15. The electronic device according to claim 14, wherein the first electrode is a transparent electrode and the second electrode is a reflective electrode, and the first light shielding film covers the second electrode.

* * * * *